United States Patent
Lu et al.

(10) Patent No.: US 6,831,008 B2
(45) Date of Patent: Dec. 14, 2004

(54) NICKEL SILICIDE—SILICON NITRIDE ADHESION THROUGH SURFACE PASSIVATION

(75) Inventors: Jiong-Ping Lu, Richardson, TX (US); Glenn J. Tessmer, Richardson, TX (US); Melissa M. Hewson, Plano, TX (US); Donald S. Miles, Plano, TX (US); Ralf B. Willecke, Dallas, TX (US); Andrew J. McKerrow, Dallas, TX (US); Brian K. Kirkpatrick, Allen, TX (US); Clinton L. Montgomery, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/261,791

(22) Filed: Sep. 30, 2002

(65) Prior Publication Data

US 2004/0061184 A1 Apr. 1, 2004

(51) Int. Cl.$^7$ .............................. H01L 21/44
(52) U.S. Cl. ..................... 438/655; 438/682; 438/775
(58) Field of Search .................. 438/655, 682, 438/685, 775; 257/655, 682, 685, 775

(56) References Cited

U.S. PATENT DOCUMENTS

| | | | | |
|---|---|---|---|---|
| 5,447,887 A | * | 9/1995 | Filipiak et al. | 438/644 |
| 5,960,303 A | * | 9/1999 | Hill | 438/592 |
| 6,188,117 B1 | * | 2/2001 | Jan et al. | 257/413 |
| 6,576,546 B2 | * | 6/2003 | Gilbert et al. | 438/629 |
| 6,586,333 B1 | * | 7/2003 | Woo et al. | 438/682 |

OTHER PUBLICATIONS

Pending U.S. application No. 10/288,717 filed Nov. 6, 2002, "Method for Reducing Contamination, Copper Reduction, and Depositing a Dielectric Layer on a Semiconductor Device", Tessmer et al.

* cited by examiner

*Primary Examiner*—Allan R. Wilson
(74) *Attorney, Agent, or Firm*—Yingsheng Tung; Wade James Brady, III; Frederick J. Telecky, Jr.

(57) ABSTRACT

A process for forming nickel silicide and silicon nitride structure in a semiconductor integrated circuit device is described. Good adhesion between the nickel silicide and the silicon nitride is accomplished by passivating the nickel suicide surface with nitrogen. The passivation may be performed by treating the nickel silicide surface with plasma activated nitrogen species. An alternative passivation method is to cover the nickel silicide with a film of metal nitride and heat the substrate to about 500° C. Another alternative method is to sputter deposit silicon nitride on top of nickel silicide.

15 Claims, 3 Drawing Sheets

NICKEL SILICIDE— SILICON NITRIDE ADHESION THROUGH SURFACE PASSIVATION

FIELD OF INVENTION

This invention relates to the field of semiconductor integrated devices, and particularly relates to a process of surface passivation for improving adhesion between a nickel silicide layer and a silicon nitride layer.

DESCRIPTION OF THE RELATED ART

The performance of a silicon integrated circuit is related to its component size. Small components enable more integrated functionality and faster operation. One technical challenge to the engineers in their endeavor to reduce the silicon integrated circuit component size is to maintain the conductance of the conductive lines that hook up the circuit components. One type of conductive line currently used in the silicon integrated circuit industry is refractory metal silicide clad silicon. For example, cobalt silicide clad silicon is the material of choice in making MOS transistor gate electrodes and the source and drain region of high-performance logic circuits.

Cobalt silicide clad silicon served its designed purpose well. But cobalt silicide process encounters problems when polysilicon line becomes narrower than 50 nanometers. One problem is that cobalt silicide requires a temperature of about 700° C. to form, which over taxes the thermal budget of total process. Another problem is at 700° C., grains in the polysilicon conglomerate, which reduces the polysilicon volume and causes the formation of voids in the polysilicon lines. Depending on the width of the polysilicon line and the density and the size of the voids, the conductance of the polysilicon line may vary substantially.

To overcome the shortcomings of cobalt silicide, engineers turn to nickel silicide. Nickel reacts with silicon and forms nickel silicide at a temperature below 300° C. We have demonstrated that between 260° C. and 310° C., we can form nickel silicide alloy that is rich in nickel and has stable sheet resistance with good uniformity. The resistivity drops further when the alloy is treated at between 400° C. to 550° C. and the alloy converts substantially to nickel mono-silicide. The lowering of process temperature to about 500° C. effectively eliminates or substantially reduces the problem of polysilicon grain conglomeration and substantially conserves the thermal budget of the total process.

There are problems, however, that keep the nickel silicide clad polysilicon process from widely implemented. One known problem is that the insulation layer, usually a silicon nitride film, which forms on the surface of the nickel suicide, has a tendency to blister or peel off from the silicide surface. This poor adhesion of this insulation layer causes undesirable excessive power consumption and reliability problem.

Engineers in semiconductor equipment manufacturing companies and integrated circuit manufacturing companies have been trying to solve the adhesion problem without success. The present invention effectively eliminates or substantially reduces this problem.

SUMMARY OF THE INVENTION

We have determined that the root cause of the poor adhesion between the nickel silicide and the silicon nitride is the presence of a silicon rich interface film. The present invention eliminates or substantially reduces the adhesion problem by preventing such film from formation.

In the known art, a thin silicon nitride layer is usually provided in combination with a thicker silicon dioxide film for insulating the conductive nickel silicide material electrically from other conductive materials. It is usually formed in a plasma reactor with a plasma enhanced chemical vapor deposition (PECVD) process.

The environment of the reactor is a gaseous mixture comprises ammonia and silane. Energy in the form of radio frequency signal activates molecules of silane and ammonia in the plasma and produces silicon and nitrogen species. Silicon and nitrogen species react and form silicon nitride on the surface of the semiconductor substrate.

In the presence of nickel silicide, however, silane decomposes and produces silicon without the aid the radio frequency signal. Without an abundance of activated nitrogen to form the desired silicon nitride, the silicon species precipitates on the substrate surface and forms a silicon rich film that is the cause of the adhesion problem.

The present invention solves this problem by preventing the formation of this silicon rich film. In one embodiment of the present invention, ammonia is first activated by the radio frequency signal in the absence of silicon carrying gas. The nitrogen species from the activated ammonia passivates the nickel silicide surface. Subsequently, silane or other silicon carrying gas may be mixed in the reactor to form silicon nitride.

In another embodiment of the present invention, nitrogen gas is first activated by the radio frequency signal in the absence of silicon carrying gas. The nitrogen species from the activated nitrogen gas passivates the nickel silicide surface. Subsequently, silane or other silicon carrying gas may be mixed in the reactor to form silicon nitride.

In yet another embodiment of the present invention, the semiconductor substrate is deposited with a film of titanium nitride or other transition metal nitride. The nitrogen species in the nitride film reacts with the nickel silicide at an elevated temperature around 500° C. to passivate the nickel silicide surface. Once the surface is adequately passivated and the residual metal nitride layer is removed, silicon nitride film formation may proceed.

In yet another embodiment of the present invention, a physical sputtering process deposits the silicon nitride film on the semiconductor substrate where the target comprises silicon nitride material.

DETAILED DESCRIPTION OF SPECIFIC EMBODIMENTS

Figure 1:
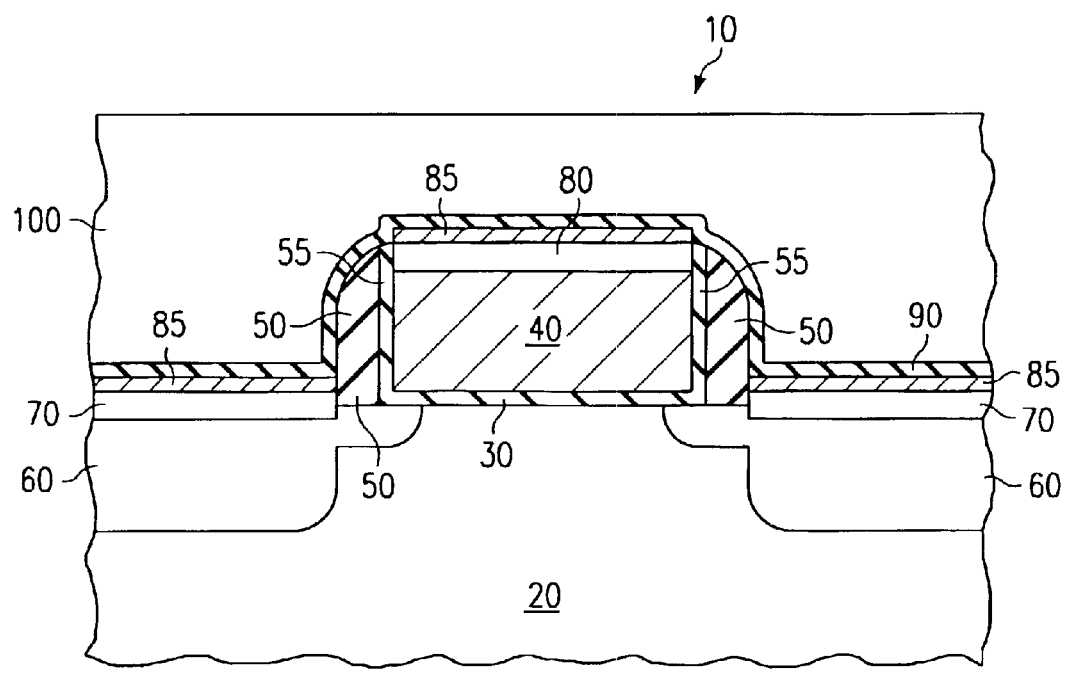
FIG. 1 depicts the cross section of a MOS transistor where a silicon rich film is present between the nickel silicide and silicon nitride.

FIG. 1 depicts a silicon CMOS transistor 10 manufactured with a known process of nickel silicidation in which a silicon substrate 20 is provided. The active areas where transistors of the integrated circuit are designated are covered with a thin layer of silicon dioxide 30. A polysilicon film 40, in the form of aggregated polycrystalline grains of a desired grain size, is deposited on the silicon substrate. The polysilicon film may be doped with proper chemical elements such as phosphorous, boron, and arsenic to achieve a desired electrical resistivity. Silicidation reduces the resistivity still further.

The polysilicon is patterned and etched to form a line pattern according to the integrated circuit design. With the photoresist pattern as a shield to cover the line pattern, the portion of polysilicon that is uncovered is removed, usually with a plasma enhanced chemical etch process.

Following the polysilicon line formation, pockets of the silicon substrate are doped by ion implant to form the source-drain regions 60. The formation of the source-drain regions usually includes the formation of insulation materials 50 and 55 on the sidewalls of the polysilicon lines. In this example, material 50 is silicon nitride and material 55 is silicon dioxide. The insulation materials are referred to as the sidewall spacers. The sidewall spacers serve a multitude of functions, one of which is to separate the source-drain regions 60 electrically from the polysilicon line 40 that forms the gate of the transistor 100.

With the polysilicon lines 40 and the sidewall spacers 50 and 55 in place, a layer of nickel film is applied to the top of the substrate. The nickel film makes contact to the top surface of the polysilicon lines, the sidewall spacers and the surfaces of the source and drain regions. The polysilicon lines and the source and drain regions comprise silicon material.

The silicon substrate with the deposited nickel film then goes through a two-step heat-treatment process. The temperature at the first step is about 260° C. to 310° C. In this temperature range, nickel reacts with polysilicon lines 80 and the source-drain regions 70 and forms a nickel-rich silicide alloy. Nickel does not react, however, with the sidewall spacers, which are made of dielectric material. Residual nickel is removed from the substrate surface after the first step heat-treatment. The temperature of the second step is about 400 to 550° C. In this temperature range, the nickel rich silicide alloy converts to nickel mono-silicide with nickel and silicon atomic number ratio close to one.

Nickel silicide clad polysilicon makes one type of a plurality of conductive line means in a modem integrated circuit. Other types include aluminum, tungsten, and copper and other metal alloys and they are disposed in different geometric planes of the integrated circuit. Nickel silicide clad polysilicon lines are usually connected to the other types of conductive lines by conductive plugs placed in via-holes through insulation layers that otherwise separate the silicide from other conductive lines.

The insulation layers typically include a silicon nitride layer 90 in the order of 20 to 40 nanometers that lies immediate on the silicide and a silicon oxide layer 100 that may be over 1 micrometer thick and sits on top of the nitride layer. One purpose for employing a two-layered insulation is for process control, specifically, the nitride layer serves as etch stop during via-hole formation.

The via-holes are formed with pattern and etch process known to those with ordinary skill in the art of integrated circuit manufacturing. The silicon oxide layer is partially uncovered by a pattern of photoresist. Etching is by reacting fluorine species activated in a plasma with the uncovered silicon oxide. Because fluorine reacts much slower with silicon nitride than with silicon oxide, the etching process effectively stops once it advances through the silicon dioxide layer and uncovers the silicon nitride film.

The silicon nitride film 90 is formed with a plasma enhanced chemical vapor deposition (PECVD) process in the known art in which silicon species reacts with nitrogen species in a plasma environment and forms a silicon nitride on the silicon substrate. The silicon species may come from gaseous silane and the nitrogen species from ammonia. When the silicide alloy is formed with refractory metals such as titanium or cobalt, the silicon nitride film such formed adheres satisfactorily to the silicide surface. When the silicide alloy is formed with nickel, however, an unexpected phenomena takes place at the silicide surface: gaseous silane dissociates prematurely into silicon under the process condition and the silicon species forms a silicon-rich film 85 on the silicide surface.

Figure 2:
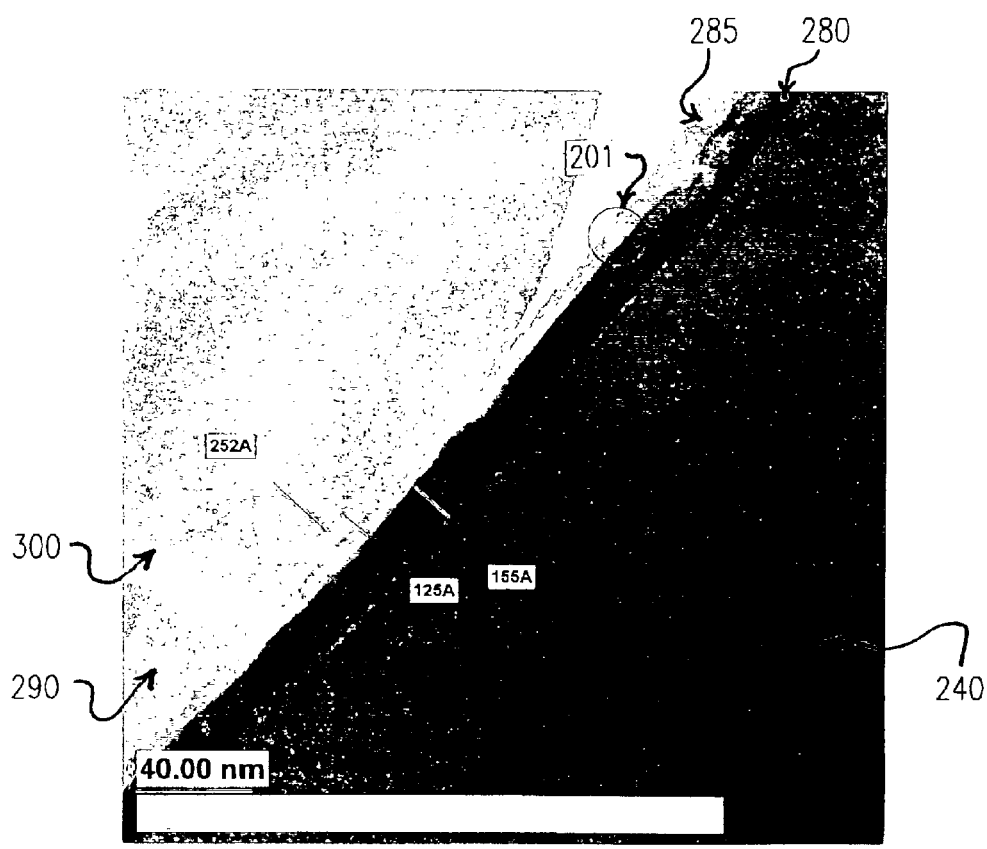
FIG. 2 is a transmission electron micrograph of a structure comprises nickel silicide, silicon rich film and silicon nitride.

As depicted in FIG. 2, the existence of a silicon rich film 285 on the nickel silicide 280 has adverse effect on the silicon nitride 290 adhering to the silicide 280 and this degrades the integrity of the structure because the silicon nitride film 290 may blister and peel off from the structure.

Figure 3:
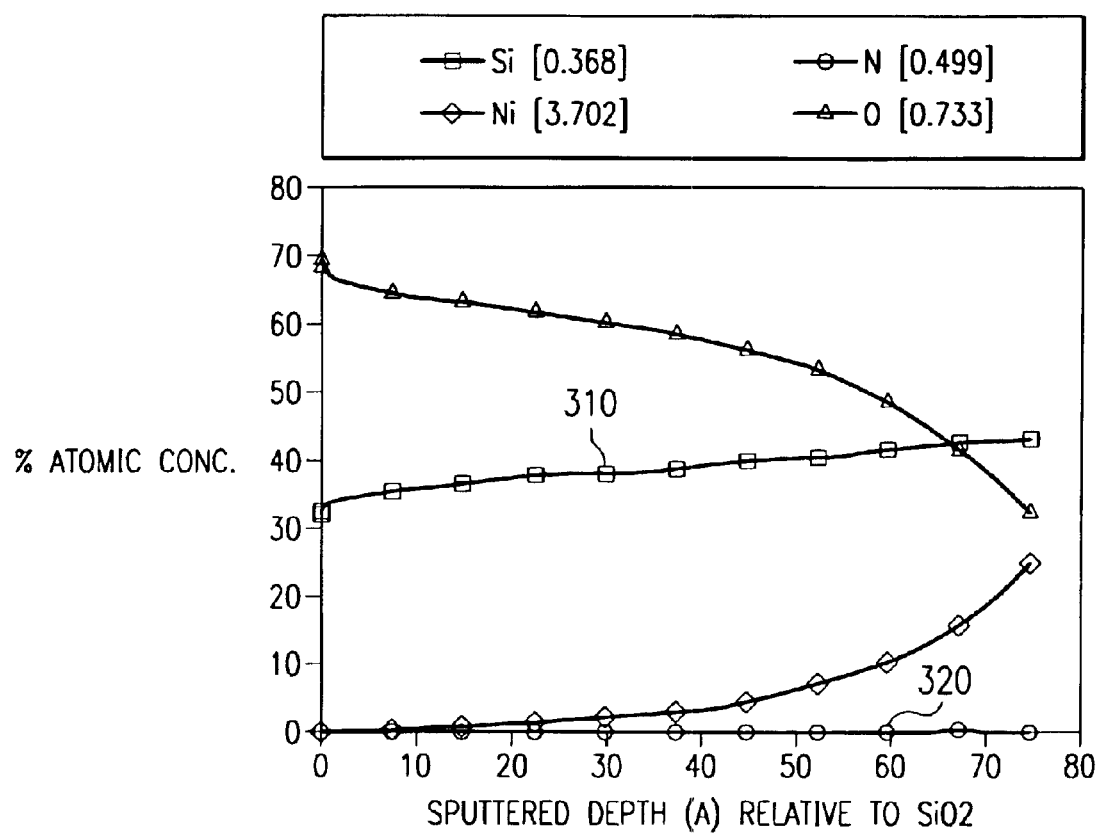
FIG. 3 is a XPS representation of the percentage composition of the structure in FIG. 2.

FIG. 3 depicts the XPS depth file of the film 285 in FIG. 2 at the vicinity of area 201. From the figure, one can ascertain that the film 285 is rich in silicon 310 and is virtually void of nitrogen 320.

Figure 4:
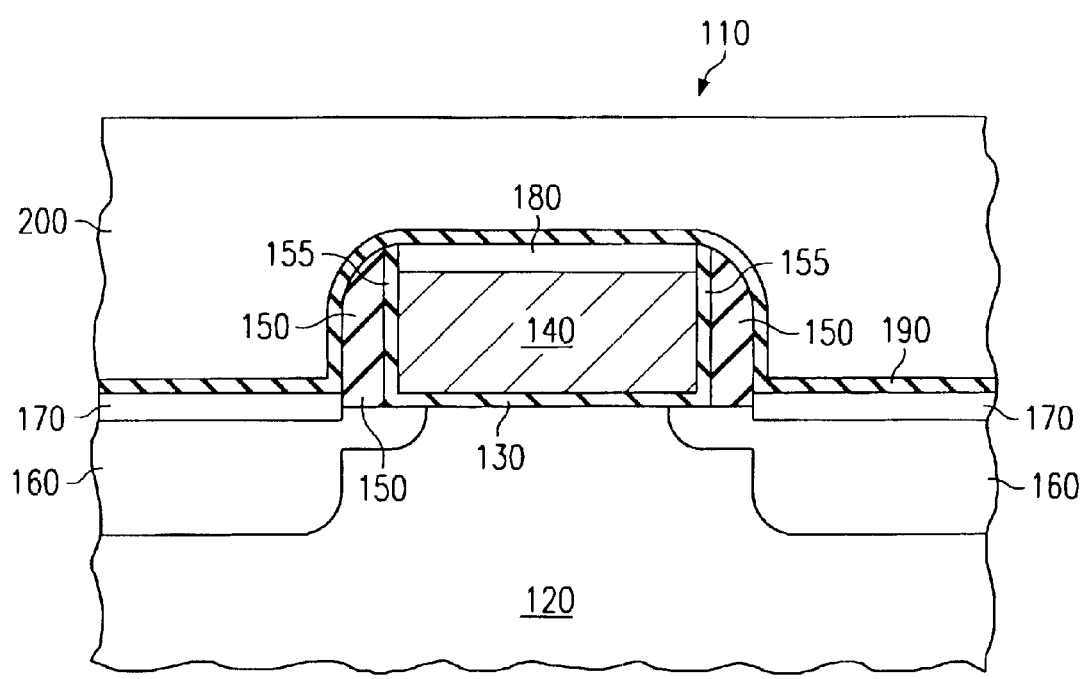
FIG. 4 depicts the cross section of a MOS transistor where the silicon rich film is absent between the nickel silicide and silicon nitride.

FIG. 4 depicts a silicon CMOS transistor 110 manufactured with processes of this invention. Note the absence of a film between regions 170, 180 and the silicon nitride film 190.

Figure 5:
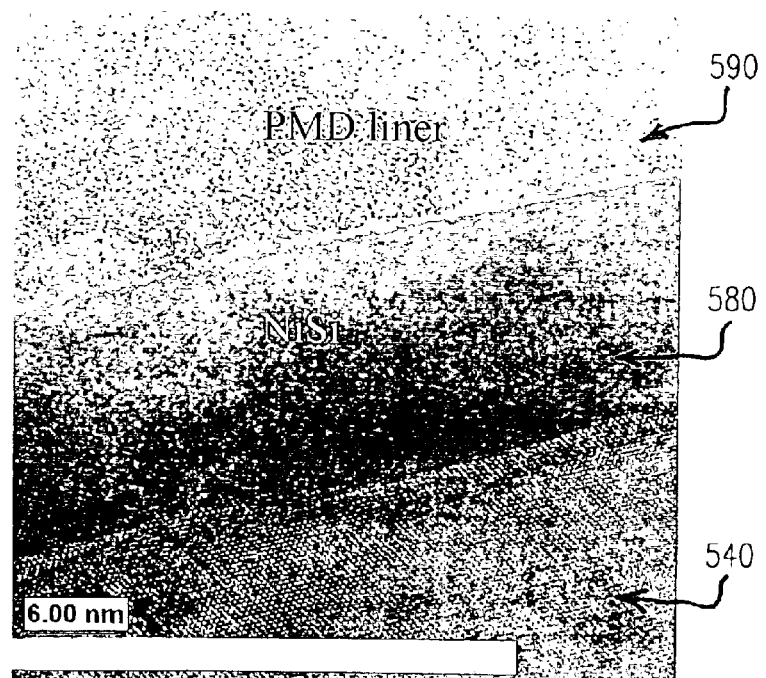
FIG. 5 is a transmission electron micrograph representation of a nickel silicide and silicon nitride absent of a silicon rich film.

FIG. 5 is a transmission electron micrograph of a structure that comprises silicon 540, nickel silicide 580, and silicon nitride 590. FIG. 5 depicts the result of a process of the present invention. Note the absence of a silicon-rich film between nickel silicide 580 and the silicon nitride 590.

In the following sections, embodiments of this invention by way of examples are described.

In the first embodiment, a nickel silicide is provided on the silicon substrate with the two-step heat-treatment process as described above. In order to prevent the silicon rich layer 285 as shown in FIG. 2 from forming, a process step is added to the silicon nitride deposition process. In this step, ammonia or other nitrogen carrying gaseous material such as nitrogen gas is introduced into the plasma reactor chamber. The gaseous atmosphere in the reactor chamber is substantially free of silicon species. Plasma is then induced by the application of a radio frequency signal that in term activates the nitrogen carrying gaseous material such as ammonia. The active nitrogen species reacts with the nickel silicide surface and passivates the nickel silicide surface.

With the nickel silicide surface thus passivated, silicon nitride deposition may continue as described above. The silicon nitride deposition may be carried out in the same plasma reactor chamber or in a separate reactor chamber.

In the second embodiment, the first step of the two-step silicidation heat-treatment process is performed as described, that is, heat-treat the substrate at 260 to 310° C. to form a nickel rich alloy at source, drain and polysilicon line regions and the residual nickel is removed. Before the second step of silicidation, a metal nitride film such as titanium nitride is disposed on the substrate, covering the nickel silicide. The second step of the heat treatment is then performed at 400 to 550° C. to convert the nickel rich alloy to a nickel mono-silicide alloy. During the second step of heat treatment, the nitrogen from the metal nitride film gets incorporated in the nickel silicide surface and thus passivates the nickel silicide. The titanium nitride film is subsequently removed from the surface of the substrate before the silicon nitride film deposition.

This invention is applicable to integrated circuits manufactured on substrates other than silicon, for example, on silicon on insulator (SOI), or silicon germanium (Si—Ge) substrate. It also applies to integrated circuit whose components comprise other than MOS transistors such as, for example, bipolar transistors, diodes, capacitors, and resistors. It also applies to electric devices other than integrated circuits such as, for example, heaters.

What is claimed is:

1. A process of forming a semiconductor device, comprising
   a. providing a substrate having a top surface, at least a portion of the top surface including a region of a silicide material;
   b. subjecting the top surface that includes the region of the silicide material to an environment that contains activated species of nitrogen and that is substantially devoid of silicon to prevent the formation of a silicon-rich layer and to form a nitrogen passivated silicide surface; and
   c. forming on the nitrogen passivated silicide surface a dielectric layer that includes silicon.

2. The process of claim 1, wherein the silicide material includes nickel silicide.

3. The process in claim 2, further comprising forming the nickel silicide region with a self-aligned process.

4. The process of claim 1, wherein the activated species of nitrogen includes partially ionized gaseous material that contains nitrogen.

5. The process of claim 4, wherein the activated species of nitrogen includes ammonia.

6. The process of claim 4, wherein the activated species of nitrogen includes nitrogen gas.

7. The process of claim 4, wherein the environment includes a plasma reactor chamber.

8. The process of claim 7, wherein the dielectric layer includes a silicon nitride layer.

9. The process of claim 1, wherein the activated species of nitrogen includes nitrogen in a nitride material.

10. The process of claim 9, wherein the nitride material includes titanium nitride.

11. The process of claim 9, wherein the nitride forms a layer outwardly from the silicide region.

12. The process of claim 10, further comprising removing the titanium nitride material.

13. The process of claim 1, wherein the dielectric layer includes a silicon nitride layer.

14. A process of forming a semiconductor device, comprising
   a. providing a substrate having a top surface, at least a portion of the top surface including a silicon region;
   b. forming a layer of nickel outwardly from the top surface, adjacent to the top surface that includes the silicon region;
   c. forming a titanium nitride cap layer outwardly from the top surface, the cap layer covering at least a portion of the nickel layer;
   d. forming a nickel silicide region on the top surface by heating the substrate at about 290° C.;
   e. removing the titanium nitride layer and the residual nickel layer from the top surface;
   f. heating the substrate at about 500° C.;
   g. treating the top surface in a plasma reactor with a gaseous material that contains ammonia and is substantially free of silicon; and
   h. forming a silicon nitride layer outwardly from the top surface.

15. A process of forming a semiconductor device, comprising
   a. providing a substrate having a top surface, at least a portion of the top surface including a silicon region;
   b. forming a layer of nickel outwardly from the top surface, adjacent to the top surface that includes the silicon region;
   c. forming a nickel silicide region on the top surface by heating the substrate at about 290° C.;
   d. heating the substrate at about 500° C.;
   e. treating the top surface in a plasma reactor with a gaseous material that contains ammonia to passivates the nickel silicide surface;
   f. treating the passivated nickel silicide surface in a plasma reactor with a gaseous material that contains ammonia and silane to form a silicon nitride layer outwardly from the top surface.

* * * * *